United States Patent [19]

Feldman

[11] Patent Number: 4,912,014

[45] Date of Patent: Mar. 27, 1990

[54] IMAGING SHEET HAVING AN OPEN POROUS MATRIX CONTAINING A PHOTOHARDENABLE COMPOSITION, AND A METHOD FOR USE OF SUCH A SHEET

[75] Inventor: Lyudmila Feldman, Centerville, Ohio

[73] Assignee: The Mead Corporation, Dayton, Ohio

[21] Appl. No.: 287,319

[22] Filed: Dec. 21, 1988

Related U.S. Application Data

[63] Continuation-in-part of Ser. No. 258,550, Oct. 17, 1988.

[51] Int. Cl.[4] ............................ G03C 5/54; B32B 3/12
[52] U.S. Cl. ............................ 430/202; 430/211;
430/235; 430/253; 430/293; 430/291; 430/281;
430/365; 430/138; 428/117; 428/305.5;
428/310.5
[58] Field of Search ............... 430/211, 202, 235, 253,
430/293, 365, 281, 291, 138; 428/117, 305.5,
310.5

[56] References Cited

U.S. PATENT DOCUMENTS

| | | | |
|---|---|---|---|
| 3,615,435 | 10/1971 | Chu | 430/271 |
| 3,891,441 | 6/1975 | Tsuji et al. | 430/253 |
| 4,375,507 | 3/1983 | Whitmore | 430/236 |
| 4,386,145 | 5/1983 | Gilmour | 430/7 |
| 4,764,451 | 8/1988 | Ishikawa | 430/138 |

*Primary Examiner*—Paul R. Michl
*Assistant Examiner*—Christopher D. RoDee
*Attorney, Agent, or Firm*—Thompson, Hine and Flory

[57] ABSTRACT

An imaging sheet comprising a substrate having an open porous matrix and a photohardenable composition contained within said porous matrix; said imaging sheet being useful in a process wherein said sheet is image-wise exposed to actinic radiation and is subjected to pressure to cause said photohardenable composition to image-wise exude from said porous matrix to a receiver sheet is disclosed. Also disclosed is a process for forming an image by using the inventive imaging sheet, an imaging system including the inventive imaging sheet, and a process for forming a lithographic printing plate by using the inventive imaging sheet.

29 Claims, 7 Drawing Sheets

IMAGING SHEET HAVING AN OPEN POROUS MATRIX CONTAINING A PHOTOHARDENABLE COMPOSITION, AND A METHOD FOR USE OF SUCH A SHEET

BACKGROUND OF THE INVENTION

This is a continuation-in-part application of U.S. application Ser. No. 258,550, filed Oct. 17, 1988.

1. Field of the Invention

The present invention relates to imaging systems, and more particularly, to an imaging sheet and method for using the imaging sheet wherein the imaging sheet has an open porous matrix which houses a photohardenable or photosoftenable composition.

2. Description of the Prior Art

Photosensitive imaging systems are well known in the art. For example, photosensitive imaging system employing microencapsulated radiation sensitive compositions are the subject of commonly assigned U.S. Pat. Nos. 4,399,209 and 4,416,966 to The Mead Corporation. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Image-wise exposure hardens the internal phase of the microcapsules. Following exposure, the imaging sheet is subjected to a uniform rupturing force by passing the sheet between a pair of rollers.

Although the above described systems have proved to be extremely successful, a critical feature of the invention resides in the use of photosensitive microcapsules. Accordingly, when producing the microcapsules, a practitioner has to take special precautions to ensure proper formation of the microcapsules. Further, the costs of production are increased as a result o the starting materials and processing conditions required to form the microcapsules.

Other photosensitive transfer imaging systems have been proposed in the art. For example, U.K. patent No. 1,001,832 assigned to E.I. DuPont de Nemours & Co. discloses an imaging material in which a color former is incorporated in a layer of a photopolymerizable, ethylenically unsaturated compound and an oxygen impermeable cover sheet is placed over the photopolymerizable layer during exposure to limit the concentration of atmospheric oxygen in contact with the photopolymerizable layer and thereby increase the speed and sensitivity of the photopolymerizable material. In practice, the photopolymerizable material is admixed with an additional material to produce a composition which is sufficiently tacky to be applied onto a support. The coated composition acts as a unitary layer, and does not apparently penetrate the substrate upon which it is coated.

U.K. patent Nos. 1,058,798, 1,141,475 and 1,193,923 also assigned to E.I. DuPont de Nemours & Co. relate to imaging materials which employ a photopolymerizable substratum comprising a solid binder having a polymerizable ethylenically unsaturated compound dispersed therein. Images are formed by image-wise exposing the materials to actinic radiation. Exposure controls the rate of diffusion of a developer material into or out of the photopolymerizable substratum.

U.S. Pat. No. 3,387,974 assigned to Eastman Kodak Co. discloses a photographic transfer element wherein a photosensitive material typically a thermoplastic material containing therein a photopolymerizable material, is coated onto a substrate. The composition is applied to the substrate as a unitary layer. It is necessary that the composition be controlled during transfer to produce high quality images. Coated onto the upper surface of the photosensitive layer is a porous overcoat which functions to regulate and meter transfer of the photosensitive material from the substrate to a receiving surface. The porous overcoat layer also functions to reduce undesired lateral spreading of the photosensitive coating during transfer and protects the photosensitive layer against abrasion and contamination. The use of the porous overcoat layer does not apparently assist in controlling the film speed and other photographic properties of the photosensitive coating.

U.S. Pat. No. 3,779,775 assigned to Fuji Photo Film Co., Ltd. discloses a light sensitive material, typically a silver halide material, which is maintained in pores of a plastic material. The porous material is utilized to prevent degradation of the photosensitive material by water, and to avoid the use of a gelatinous binder for housing the photosensitive material. This reference does not disclose that the pores of the plastic layer may contain a photohardenable or photosoftenable composition.

U.S. Pat. Nos. 4,390,614 and 4,420,552 assigned to Richard Peck disclose a method for producing printed images by utilizing a color facsimile printing device. The inventions are characterized by utilizing a porous substrate wherein photosensitive ink is maintained. The photosensitive inks utilized according to these references are preferably based upon silver halide emulsion materials. Neither reference discloses that the porous material contains a photohardenable or photosoftenable composition.

None of the above described systems exhibit the photosensitive characteristics of the above descried Mead microcapsule imaging systems wherein a photopolymerizable material is contained in the internal phase of microcapsules. Accordingly, there exists a need in the art for an alternative imaging system having the photographic characteristics of the Mead photopolymerizable image-forming materials without requiring the photosensitive material to be microencapsulated.

BRIEF SUMMARY OF THE INVENTION

In accordance with the present invention, an imaging sheet having an open porous matrix and a photohardenable or photosoftenable composition contained within the porous matrix is provided. The combination of the porosity of the imaging sheet and the photosensitive material contained within the porous matrix enables high quality images to be produced by a transfer process. The imaging sheet is useful in a process wherein the sheet is image-wise exposed to actinic radiation and is subjected to pressure to cause the photohardenable or photosoftenable composition to image-wise exude from the porous matrix to a receiver sheet. The imaging sheet is useful in forming a number of different types of images by a number of different processes.

For example, if a dye is incorporated into the open porous matrix with the photosensitive composition, upon image-wise exposure and the application of pressure in the presence of a receiver sheet, the dye image-wise transfers to the sheet to form a visible image.

Alternatively, the photosensitive composition may include a colorless image-forming agent which forms an image upon reaction with a developer material. In this embodiment, the photosensitive composition is image-wise exposed and pressure is applied t the porous matrix to cause the image-forming agent to exude from the porous matrix and contact a sheet which contains a developer material. The image-forming agent and developer material combine to form an image in the areas of image-wise release.

In yet another use, the photosensitive composition contains a photohardenable material which is incorporated into the open porous matrix. Upon exposure to actinic radiation, the material selectively hardens in direct proportion to amount of incident radiation acting upon the material. The non-exposed photohardenable composition is then removed from the matrix to form an image on the imaging sheet. The formed images may be used to measure photographic properties of the photosensitive material such as gamma and dynamic range.

In still another use, the substrate may function as the receiver sheet and a direct development technique, such as those commonly known in the art, may be utilized. For example, the imaging sheet may be image-wise exposed to actinic radiation and subsequently coated with a developer material to produce a visible image in the non-exposed areas of the substrate.

The substrate selected for use as the imaging sheet can take many forms. In one embodiment, the substrate can be a polymeric material having a plurality of pores or vertical channels located throughout the substrate. In another embodiment, the sheet may take the form of a woven or non-woven fibrous mat or paper. In yet another embodiment, a substrate may be coated with a material capable of providing an open porous matrix. In any of the above embodiments, depending upon the amount of image-forming agent maintained the porous matrix, single or multiple copies can be produced from the substrate.

In still another embodiment, the imaging sheet may take the form of a gravure type printing plate. In this embodiment the pores of a substrate having an open porous matrix are filled with a photohardenable composition and the substrate is image-wise exposed to actinic radiation to selectively harden the photohardenable composition. The non-photohardened areas are evacuated by using means such as pressure and the evacuated pores are filled with printing ink to produce a plate suitable for printing. Depending upon the amount of image-forming agent maintained in the pores and the pressure used to cause the printing ink to exude from the pores, a multiple number of images are produced. In a similar manner, the porous matrix substrate may function as a screen for screen type printing.

The imaging sheet may be used to produced monochromatic or full-color images. For example, to produce a full-color image, a number of embodiments are envisioned. A first embodiment comprises distributing each of three image-forming agents into the porous matrix such that no image-forming agent intermixing occurs. A second embodiment comprises superimposing a highly registered transparent full color mask onto a monochromatic black negative image such that an artificial full color image appears as a result of viewing the image through the transparent mask. A third embodiment comprises using an imaging sheet having three independent regions, each having the same area as the area of the desired final image. Each of the three regions has associated with it one of three color-forming agents whereupon the three regions are sequentially exposed and sequentially developed in the presence of a receiver sheet to produce a full color image. A fourth embodiment comprises using an imaging sheet having three different pore sizes. In this embodiment each of three different color-forming compositions are particularly designed so that they can be distributed in only one of the pore sizes.

In another embodiment, a process for producing an image by using the inventive imaging sheet is provided. This process comprises the steps of: image-wise exposing a substrate having an open porous matrix containing a photohardenable or photosoftenable composition therein to actinic radiation; assembling said imaging sheet with a receiver sheet; and applying pressure to said imaging sheet to cause said image-forming agent to image-wise exude from said porous matrix ad transfer to form an image on said receiver sheet.

This imaging process is capable of producing monochromatic or full color images and may be used in a wide number of practical applications including reproducing photographs, written text, and other visible images.

In yet another embodiment, the present invention provides an imaging system using the inventive imaging sheet. The system includes an imaging sheet comprising a substrate having an open porous matrix and an image-forming agent and a photohardenable or photosoftenable composition contained within said porous matrix, said imaging sheet being useful in a process wherein said sheet is image-wise exposed to actinic radiation and is subjected to pressure to cause said image-forming agent and said photohardenable or photosoftenable composition to image-wise exude from said porous matrix; and a receiver sheet for receiving said image-forming agent when said imaging sheet is subjected to pressure to cause said image-forming agent and said photohardenable or photosoftenable composition to image-wise exude from said porous matrix.

In yet another embodiment of the present invention, a process for producing a lithographic printing plate is provided. This process comprises the steps of: providing an imaging sheet comprising a substrate having an open porous matrix and a photohardenable composition contained within said porous matrix; image-wise exposing said imaging sheet to actinic radiation; assembling said imaging sheet with a support for printing plate; subjecting said image-wise exposed imaging sheet to pressure such that said photohardenable composition exudes from said porous matrix and image-wise transfers to said support for said printing plate and hardening said transferred photohardenable composition to form a polymer image which accepts ink and rejects water. In use, printing ink is applied to the produced plate such that the photohardened portions of the printing plate accepts the ink used for printing images and the non-photohardened areas reject the ink.

DETAILED DESCRIPTION OF THE PREFERRED EMBODIMENTS

In describing the preferred embodiments, certain terminology will be utilized for the sake of clarity. It is to be understood that such terminology includes not only the recited embodiments but all technical equivalents which perform substantially the same function in substantially the same way to obtain the same result.

Figure 1:
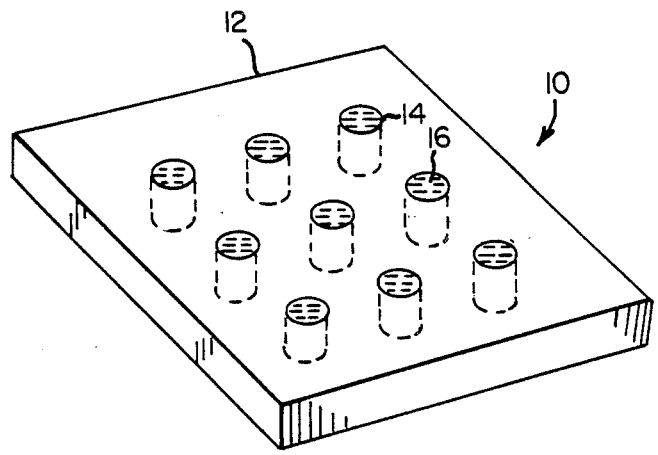
FIG. 1 is an inventive imaging sheet embodying the teachings of the instant invention.

Referring to the drawings generally, and more particularly FIG. 1 one embodiment of the inventive imaging sheet is depicted and represented by element 10. Sheet 10 comprises a substrate 12 having a plurality of pores 14 located throughout substrate 12. In the illustrated embodiment, pores 14 extend throughout the thickness of substrate 12. Contained within pores 14 is photosensitive material 16.

In practice, the size of pores 14 ranges from approximately 0.1 microns to about 10 microns. The ability to control pore size is primarily a function of the method used to create the pores and the matrix used to house the photosensitive material. In general, as the pore size is reduced in size, thereby increasing the number of pores for a given area, the resolution of the images produced increases. Resolution can also be improved by using a highly compressible material for substrate 12.

In addition, the thickness of the pores and the substrate should be selected in response to the desired use of the imaging sheet. In general, the thickness of the porous layer ranges from about 5 microns to about 100 microns. When a large number of images are desired to be produced, the amount of dye loading should be relatively high. For some applications, this may involve using a substrate having a relatively large thickness.

Substrate 12 may be constructed of a number of different materials, including, but not limited to, paper, metal, fibrous cloth, and polymeric materials. In practice, polymeric materials are particularly preferred and polyethylene, polyurethane, polyester, polycarbonate and other suitable polymers in a membrane form made by processes known in the art are especially preferred.

One feature which should be considered when selecting a porous material is that its critical surface energy is greater than the surface energy of the material which is to be contained within its porous matrix. The increased surface energy of the porous substrate enables the photosensitive material to be contained within its porous structure without running the risk of the photosensitive material inadvertently releasing from the porous matrix. In addition, the increased surface energy of the porous substrate ensures that the pores of the porous substrate are sufficiently wetted by the photosensitive material.

In addition, to produce high resolution images, the substrate should have an index of refraction which closely approximates the index of refraction of the material contained within its porous matrix. If the indices do not sufficiently match, scattering occurs at the pore interface and high resolution images are not achieved.

Further, substrate 12 must be made of a material which is capable of withstanding physical forces that occur during the imaging process, such as resistance to physical deterioration caused by compression and relaxation which accompanies application of pressure.

Pores 14 can be provided in substrate 12 by a number of alternative methods. For example, pores 14 may be created in substrate 12 by physical means such as striking a solid substrate with radiation to create holes within the substrate. By applying electron beams or laser beams to a support, pores in the micron size range can be created in the substrate.

In another method, pores may be created in a substrate during preparation of the substrate material. For example, U.S. Pat. No. 3,865,674 discloses production of a porous polyethylene substrate formed by mixing a polyethylene powder with a carrier oil to form a paste and subsequently removing the oil from the paste.

Alternatively, commercially available substrates which are porous may be selected for use in the present invention. Such substrates include open cell elastomeric materials such as polyurethane foam, porous filter materials such as polycarbonate films and polyethylene terephthalate films manufactured by Nuclepore, membranes manufactured by Metricell, and non-woven fibrous cloths. For some applications, paper materials such as commercially available filter papers are sufficiently porous enough to be suited for use in the present invention.

Sheet 10 may be used in a screen printing operation or may be used as a gravure type printing plate. When used in a screen printing operation, sheet 10 functions as the printing screen. If sheet 10 is thick enough, it can be used in a gravure type printing process and can be attached to a roll for producing a multiple number of images. When sheet 10 is made of a flexible material, such as polyethylene terephthalate, it may be particularly useful as a gravure type printing plate. Alternatively, sheet 10 may be made of metallic materials such as aluminum and steel.

Contained within pores 14 is photosensitive composition 16. Composition 16 contains a photohardenable or photosoftenable material, and optionally an image-forming agent. Photohardenable compositions such as photopolymerizable and photocrosslinkable materials increase in viscosity or solidify upon exposure to radiation and are capable of yielding positive images.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylolpropane triacrylate (TMPTA) and dipentaerythritol hydroxypentaacryate (DPHPA).

Another group of monomers useful in the present invention are monomers which can be polymerized by cationic polymerization. An example of such a monomer is vinyl ether.

Composition 16 also typically includes a photoinitiator. A preferred free radical photoinitiator system for use in the present invention includes ionic dye-counter ion compounds described in European application publication No. 0 233 587. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyrillium complexes may also be used.

Examples of other free radical photoinitiators useful in the present invention include diaryl ketone derivatives, quinones and benzoin alkyl ethers. Where ultraviolet sensitivity is desired, suitable photoinitiators include alkoxy phenyl ketones, O-acylated oximinoketones, polycyclic quinones, hexanthrenequionone, naphthoquinone, diisopropylphenanthrenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones and haloalkanes. In many cases it is advantageous to use a combination with imaging photoinitiators.

When using monomers which can be polymerized by cationic polymerization such as vinyl ether and epoxies, it is preferred that a cationic photoinitiator system be utilized. Examples of cationic photoinitiators include aryl diazonium salts, diaryliodonium salts, tri-arlysulfonium salts, and the like.

Initiators including the ionic dye complexes may preferably include an autoxidizer. Suitable examples include N,N,-dialkylanilines and thiols as described in the European Publication.

Various image-forming agents can be used in composition 16. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. Composition 16 itself may have its own image-forming capability. For example, it is known that many pigments, such as toners used in xerographic recording processes selectively adhere to the image areas of an imaging sheet exposed and developed as in the present invention.

Typical color-forming agents useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Cyan, magenta and yellow color precursors useful in the present invention are particularly preferred when full color images are produced and are commercially available.

Figure 2:
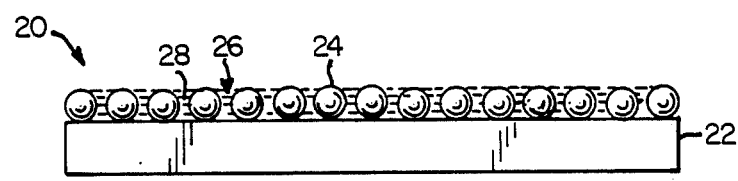
FIG. 2 is an alternative imaging sheet embodying the teachings of the instant invention.

As an alternative embodiment, an imaging sheet as shown in FIG. 2 and designated by element 20 may be utilized. Sheet 20 includes substrate 22 which may be any of the materials as described above with respect to substrate 12 as well as nonporous materials commonly known in the art including some papers and polymeric materials. Located at the upper surface of substrate 22 is a plurality of inert particles 24. Inert particles 24 are separated by interstitial areas 26 and areas 26 form the open porous matrix which contains photosensitive composition 28, which is identical to composition 16 a defined above. As is the case with the embodiment shown in FIG. 1, it is preferred that the surface energy of particles 24 is greater than the surface energy of composition 28.

Particles 24 are selected so that when in contact with the upper surface of substrate 22 they do not chemically or physically react with composition 28 to prematurely form an image or otherwise degrade composition 28. Particles 24 are sized preferably in the micron-size range, having an average diameter ranging from about 0.1 microns to about 10 microns. Examples of non-reactive particles which may be used in the present invention include polymeric materials and finely divided clays, $SiO_2$, $BaSO_4$, $CaCO_3$ and the like. Particles 24 may also take the form of microcapsules having a solid internal phase or may take the form of polymeric particulates. As the internal phase is solid, composition 28 will not react with the internal phase.

Figure 3:
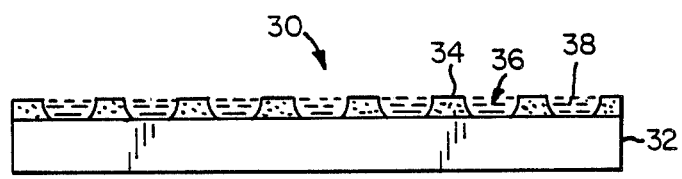
FIG. 3 is another alternative imaging sheet embodying the teachings of the instant invention.

Another embodiment for an imaging sheet having an open porous matrix is shown in FIG. 3 and is designated by substrates 12 and 22, and has a porous layer 34 coated onto it. The porous spaces in layer 34 are represented by element 36, and in these areas the photosensitive composition 38 is deposited. Composition 38 is identical to composition 16 as described with respect to FIG. 1 and composition 28 as described with respect to FIG. 2.

Porous layer 34 may be formed on substrate 32 in any of a number of different ways. One way to form layer 34 on substrate 32 is to adhere a porous material, such as compressed polyurethane, directly onto the upper surface of substrate 32. If adhesion is utilized, layer 34 must be applied onto substrate 32 such that the adhesive does not interfere with photosensitive composition 38.

Another way to form layer 34 is to roughen a continuous polymeric film, such as polyester to form a discontinuous surface. The discontinuities in the surface provide reservoirs for holding the photosensitive composition.

Another way to form areas 36 is to form a mixture of at least two materials, coat the mixture as a unitary layer 34, and selectively remove at least one of the materials from layer 34 to render it porous. For example, it is possible to coat substrate 32 with a layer 34 constituting a mixture containing a dissolved solute in a matrix such as a binder and then remove the solute to produce a matrix material which is porous as a result of the absence of solute. An example of this consists of applying onto a substrate a developer material wherein particles of a low molecular weight phenolic resin, such as a novolak, is dispersed in an acrylic binder, and removing the phenol-novolak resin by dissolving the particles in methanol. The resulting layer constitutes a porous layer of acrylic binder. Further, because the developer particles have been dissolved out of the binder, no undesired reaction or degradation of the photosensitive composition applied onto the porous layer occurs. It may be additionally desirable to provide an adherent to secure matrix 34 to substrate 32.

Other methods may be used to form layer 34 and areas 36 as would be understood by those skilled in the art. An example of such a method is the polymer assisted phase-inversion (PAPI) processing technique. See Kesting, *Synthetic Polymeric Membranes*, pp. 264-265, 2d. ed. Wiley, 1985. Another method is a film casting technique utilizing phase separation to produce a porous substrate. See *Material Science of Synthetic Membranes*, Lloyd ed., ACS, 1985. As is the case with the embodiment shown in FIG. 1, it is preferred that the surface energy of porous layer 34 is no smaller than the surface energy of photosensitive composition 38. In addition, porous layer 34 must be designed so that upon the application of pressure, the photosensitive composition 38 exudes from the porous layer to enable transfer of its contents to another sheet or the internal phase may be extracted by methods, known in the art.

Referring now to FIGS. 4(a)-(e), the production of a transfer image utilizing the inventive imaging sheet as shown in FIG. 1 is set forth. As will be appreciated by those skilled in the art, a similar process is used with respect to imaging sheets 20 and 30 with the sole difference being the substitution of the respective imaging sheets for the imaging sheet 40 shown in FIG. 4(a). To initiate the imaging process, sheet 40 is placed on cover sheet 46 which functions to protect the lower surface of substrate 40 from air and moisture. Photosensitive composition 44, is then applied to the upper surface of substrate 40 such that composition 44 flows into pores 42. In a preferred embodiment, photosensitive composition 44 constitutes a photopolymerizable monomer and a photoinitiator. Polymerization is achieved as a result of the photoinitiator generating free radicals and the monomer subsequently polymerizing by free radical polymerization. Critical to the success of the polymerization reaction is that the reaction be performed in the absence of oxygen, as oxygen consumes free radicals and thereby inhibits the reaction. In prior art microcapsule systems, the microcapsule walls function to protect the photosensitive composition against oxygen inhibition. As no microcapsule walls are in the present invention, protective means such as sheets 46 and 48 must be utilized to protect the photosensitive composition against oxygen. Sheets 46 and 48 are preferably a transparent polymer such as poly(ethylene terephthalate).

Cover sheet 48 is then applied to the upper surface of substrate 40 and pressure is applied to sheet 48 to release excess composition 44 and completely seal composition 44 from water and oxygen. Sheet 48 is transparent and preferably is made of polyethylene or other materials with good release properties toward composition 44. It is important that composition 44 be maintained within pores 42 and not wet cover sheets 46 and 48 so that cover sheets 46 and 48 do not interfere with the image-forming process. Rather, the primary function of sheets 46 and 48 is to effectively protect composition 44 against oxygen and moisture inhibition. In addition, as will be discussed below, when cover sheets 46 and 48 are removed from imaging sheet 40, composition 44 should not inadvertently transfer to sheets 46 and 48, but should remain in pores 42.

Alternatively, cover sheets 46 and 48 may take the form of heat meltable transparent thermoplastic materials which are solid at room temperature. Examples of such materials include ethylene-co-vinyl acetate and low molecular weight polyethylene wax. In practice, the heat meltable materials are coated onto the substrate in a liquid form, and upon cooling to ambient temperatures the materials solidify and prevent the photosensitive composition from being degraded by moisture or oxygen. The heat meltable materials should be transparent and have a good release property toward composition 44 so that they do not interfere with the image-forming process.

In still another embodiment, cover sheets 46 and 48 may take the form of pre-formed peelable films, solvent casted films or aerosol applied sealing materials.

Figure 4A:
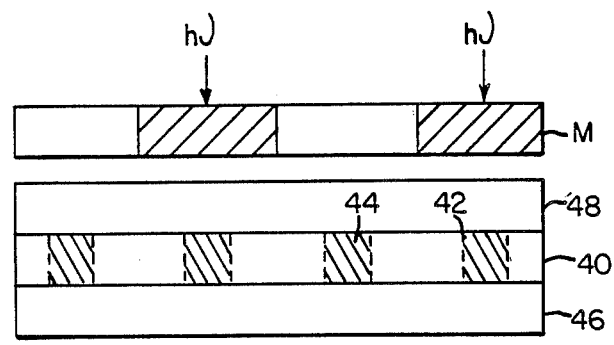
FIG. 4(a)–4(e) depicts a process for producing an image in accordance with the teachings of the instant invention.
Figure 4B:
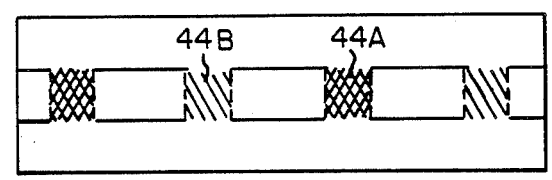
Figure 4C:
Figure 4D:
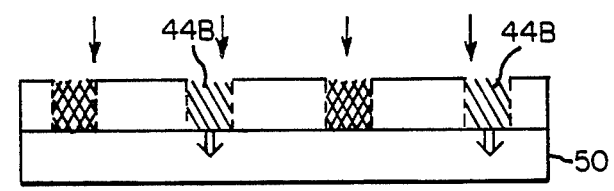
Figure 4E:
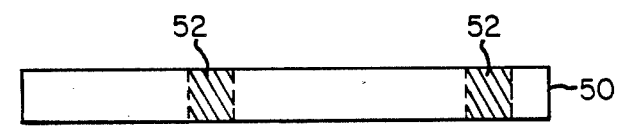

As seen in FIG. 4(a), substrate 40 is image-wise exposed to actinic radiation designated by $h\gamma$, typically wavelengths in either the infrared, visible or ultraviolet regions through mask M and through transparent cover sheet 48. As seen in FIG. 4(b), this causes the exposed portion of composition 44 to photoharden as represented by 44A whereas the non-exposed portion of composition 44 represented by 44B remains liquid. To improve the film speed of composition 44, the upper surface of cover sheet 46 may contain a reflective layer. An example of such a material is aluminized mylar (polyethylene terephthalate). Sheets 46 or 48 are removed from substrate 44 by means known in the art, such as take-up rolls (not pictured). For some applications, both sheets 46 and 48 need to be removed.

Substrate 40 is then assembled with receiver sheet 50 and pressure is exerted on the upper surface of substrate 40 to cause composition 44B to exude from pores 42 and transfer to sheet 50 whereupon an image 52 is formed on sheet 50. Sheet 50 is typically a substrate used in carbonless copy systems, such as paper or polymeric substrates, for example polyethylene terephthalate. The application of pressure is typically accomplished by utilizing the physical exertion of force such as the use of pressure rolls. However, other means including air pressure gradient or vacuum sublimation processes may be utilized to cause the composition 44B to transfer to receiver sheet 50. Depending on the thickness of sheet 40, and if there is any composition 44B remaining in pores 42 after transfer to sheet 50, multiple copies may be produced by repeating the pressure transfer step with other receiver sheets. The process may be repeated until there is no remaining composition 44B in pores 42. In an embodiment wherein the cover sheets take the form of heat meltable materials, the substrate must be heated before or during the application of pressure to enable composition 44B to exude from pores 42.

In still another embodiment, receiver sheets can be applied on both the top and bottom surfaces of sheet 40. The produced images on the two receiver sheets will be mirror images.

In an embodiment where sheet 40 functions as a gravure printing plate, after the image-wise exposure step from the back side, composition 44B is evacuated from pores 42 to leave voids which form a pattern of the image. The backside exposure functions to seal the pores of the porous matrix. Pores 42 are then filled from the front side with a printing ink (not pictured) and transfer to a receiver sheet is effected by exerting pressure on sheet 40 to cause the printing ink to exude from pores 42 and transfer to the receiver sheet.

In an embodiment where sheet 40 functions as a screen for screen printing, after the image wise exposure, the unexposed composition 44B is evacuated from pores 42. Thereafter, ink is provided to the pores vacated by composition 44B and pressure is applied to sheet 40 to transfer the ink from pores 42 to a receiver medium.

In an embodiment where composition 44 does not include an image-forming agent, images 52 may be utilized to determine the photographic properties of composition 44 such as film speed, dynamic range and gamma. Testing the photographic properties by use of sheet 40 requires the exposure of composition 44 to different amounts of radiation, and can be easily accomplished by utilizing a step wedge. Determination of the photographic properties is available because as the composition is exposed to different intensities, monomer-polymer transformation of the photohardenable composition occurs and the refractive index of the composition changes, forming an image on sheet 40. Only the unexposed and partially polymerized composition will appear as an image on sheet 40. The differences in scattering as will be seen in the image enables an easy estimate of film speed, dynamic range, gamma and the like. The imaging sheet may also be used as transparency.

In a more traditional application, composition 44 includes a dye, pigment or color-former and a highly visible image 52 is produced on sheet 50.

Where the image-forming agent is not a dye or pigment, a developer material is provided on receiver sheet 50 and is selected to react with the color-forming agent to form an image. Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acidic polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3,5-di-tert-butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. A preferred class of glossable developers is described in commonly assigned U.S. application Ser. No. 073,036, filed July 14, 1987.

Alternatively, a developer material may be directly applied to the image-wise exposed substrate such that the developer material reacts with the color-forming agent contained in the non-exposed areas to produce visible images. In this embodiment no receiver sheet is used and the imaging sheet additional functions as the receiver sheet.

The present process may be used to produce monochromatic or full-color images. To produce full-color images, special techniques have to be utilized to prevent the different color-forming agents from intermixing prior to exposure and development. Full-color imaging systems traditionally utilize compositions containing three color-forming agents, more particularly cyan, magenta and yellow color-forming agents. Each composition containing a different color-forming agent is primarily sensitive in a different wavelength band such that the respective compositions can be individually exposed with minimum crosstalk. In panchromatic systems, the cyan, magenta, and yellow forming compositions are respectively sensitive to red, green and blue light.

Figure 5:
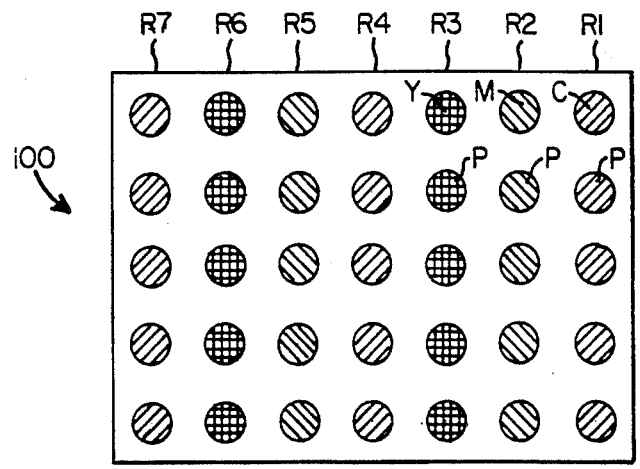
FIG. 5 depicts an imaging sheet embodying the teachings of the instant invention which is capable of producing full-color images.

A first method for forming a full-color imaging sheet involves utilizing a lithographic or gravure printing device capable of printing a geometric pattern of dots on a porous substrate. The imaging sheet produced by this method is shown in FIG. 5 and is represented by element 100. By carefully controlling printing conditions of sheet 100, a first printing may involve printing a row of dots R1 containing a cyan color-forming agent and a photohardenable composition including a photoinitiator C, shifting the printer and not printing for the next two rows (R2 and R3), and subsequently printing on the next row (R4) with the cyan color-forming composition C. The critical surface energy and the pore size of the porous matrix of sheet 100 are adjusted so that the cyan color-forming composition C is rapidly absorbed into he pores P. The porous substrate will have approximately one third of its porous surface filled with a cyan color-forming composition. The printing device then repeats the process using a second color-forming composition, such as a magenta color-forming composition M, with the only difference being that the rows of magenta color-forming dots (R2, R5) are offset from the cyan color-forming dots (R1, R4) to prevent unwanted intermixing. The procedure is repeated with a third color-forming agent, such as a yellow color-forming composition Y wherein the rows of yellow color-forming dots (R3, R6) are offset from the cyan color-forming dots and the magenta color-forming dots. The cyan, magenta and yellow color-forming dots do not intermix as a result of the pores in the matrix not being interconnected so as to thereby form a network. This printing technique is controlled by means known in the art, such as computer control. In addition, the three color-forming compositions are applied to the substrate so that they do not overlay one another. If the compositions overlay each other, it is difficult, if not impossible to accurately produce full color images. In addition, if the compositions overlay each other, they will be subject to intermixing which can cause inconsistent and imbalanced color images.

Once substrate 100 has the three different color-forming compositions C, Y, M absorbed into porous matrix P, substrate 100 is image-wise exposed to three different bands of actinic radiation to selectively harden the different compositions and the substrate is pressure contacted with a receiver sheet to cause the non-hardened compositions to image-wise exude from the porous matrix and form a full-color image on the receiver sheet.

Figure 6A:
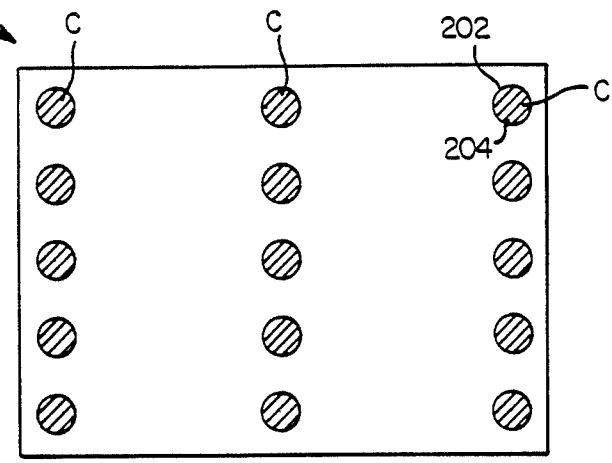
FIG. 6(a)–6(c) depicts an alternative imaging sheet embodying the teachings of the instant invention which is capable of producing full-color images.
Figure 6B:
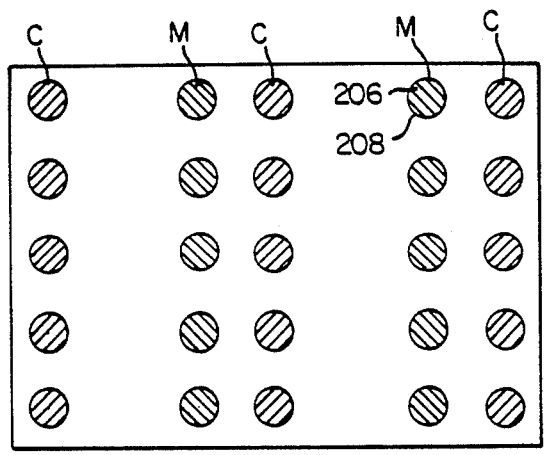
Figure 6C:
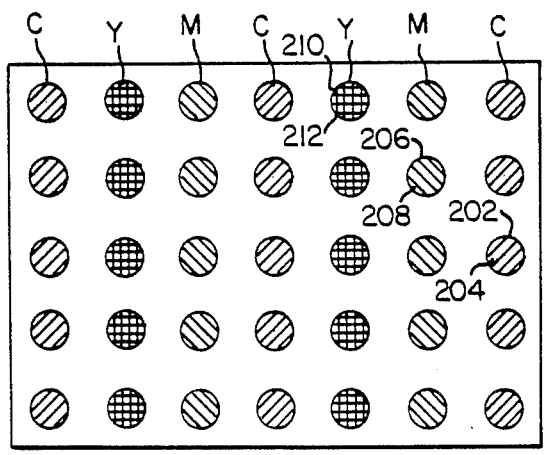

Another method for forming a full-color imaging sheet involves forming first set of pores in a substrate and subsequently filling the pores with a first color-forming composition, sealing the composition within the pores and repeating the pore formation and filling steps with other color-forming compositions as is shown in FIGS. 6(a)–6(c). Referring to FIG. 6(a), a set of pores 202 can be formed in a polyester (polyethylene terephthalate) substrate 200 by mechanical or other means as described above, the pores extending throughout the substrate and covering approximately one-third of the overall surface area of the substrate. A first photohardenable color-forming composition C, for example cyan, is then applied to the surface and composition C fills just created pores 202. The excess cyan color-forming composition C is then removed from the surface of the substrate by means such as scraping with a doctor blade (not pictured) and a heat-meltable coating 204 is applied to tee substrate to seal the cyan color-forming composition C in pores 204. Heat-meltable composition 204 should be optically transparent, provide a oxygen barrier, be compatible with cyan color-forming composition C and be readily adherent to substrate 200. Examples of such heat-meltable compositions include low melting waxes and ethylene-co-vinyl acetate polymers. Alternatively, film forming peelable materials, solvent casted films or aerosol applied sealing materials may be substituted for heat meltable composition 204. Then, while cyan color-forming composition C is effectively sealed by heat-meltable coating 204, referring to FIG. 6(b), a second set of pores 206 is created (not pictured) in substrate 200, and a second color-forming composition M, for example magenta, is coated onto substrate 200 to fill newly created pores 206. Magenta color-forming composition M does not intermix with cyan color-forming composition C as a result of the cyan color-forming composition being exclusively limited to pores 202 by the heat-meltable composition 204. Excess magenta color-forming composition M is then removed from substrate 200 (not pictured) to prevent composition M from overlaying composition C and a heat-meltable composition 208 is applied to substrate 200 to seal magenta composition M (not pictured) in pores 206. Heat-meltable composition 208 may be identical to heat-meltable composition 204 or it may differ. Composition 208 must be capable of sealing composition M in pores 206 and prevents composition M from inadvertently mixing with other compositions on substrate 200. Referring to FIG. 6(c), a third set of pores 210 is created (not pictured) in substrate 20 and a third color-forming composition Y, for example yellow, fills pores 210. Excess yellow color-forming composition Y is removed from substrate 200 and heat-meltable composition 212 is then coated onto substrate 200 to seal yellow color-forming composition Y. Composition 212 functions similarly to compositions 204 and 208, the primary purpose of composition 212 being to protect composition Y from oxygen and moisture and to prevent composition Y from intermixing with compositions C and M.

When in use, after image-wise exposing imaging sheet 200 to tree wavelengths of radiation, a heating step is additionally performed before or during the pressure development step to melt heat-meltable compositions 204, 208, 212, and enable he non-hardened color-forming compositions C, Y, M, to exude from pores 202, 206, 210, and form a full-color image when placed in pressure contact with a receiver sheet.

Figure 7:
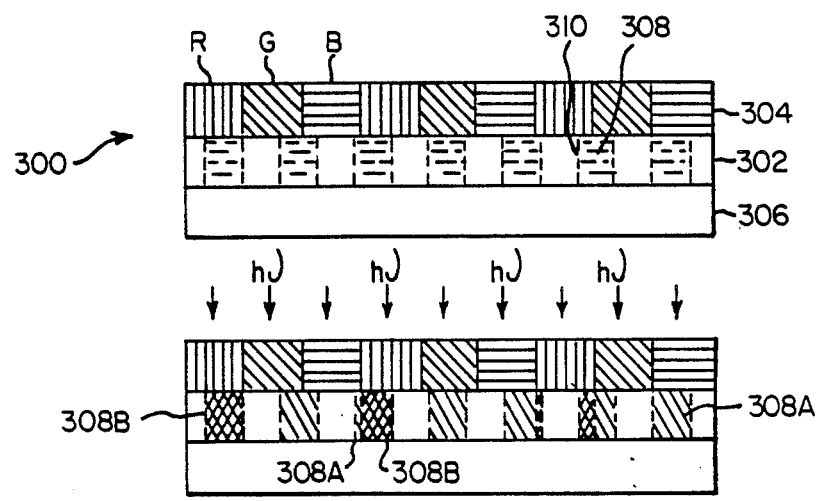
FIG. 7 depicts an alternative process for producing full-color images.
Figure 7:
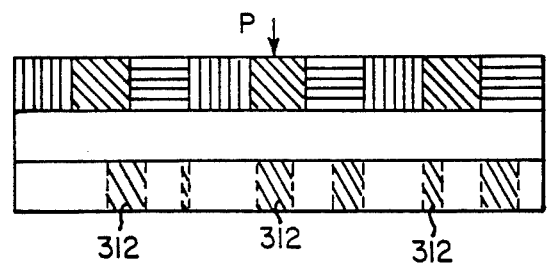

Another method for producing a full-color image involves principles developed by Polaroid Co. (Land, Photographic Science, and Engineering, 21, 5, 225–236 (1977)), regarding the manufacture of panchromatic film for instant slides and is shown in FIG. 7. Referring to FIG. 7, imaging system 300 includes imaging sheet 302, cove sheet 304 and receiver sheet 306. Imaging sheet 302 is identical to the imaging sheets described above and is transparent. The photosensitive material 308 contained within the porous matrix 310 includes at least three photoinitiators to form a broad band-width light sensitive system which is fully sensitive to visible light. The photosensitive composition contains a black color-forming agent or a mixture of cyan, magenta and yellow color-forming agents in addition to the three photoinitiators. Upon image-wise exposure to actinic radiation, depending on the visible wavelengths used for exposure, the photosensitive composition will harden.

Cover sheet 304 has a color grid printed on its surface or superimposed on its surface. The grid contains three colors, red, green and blue, as represented by R, B, G, and acts as a vehicle to provide a full color image. Grid 304 typically contains alternating red, green and blue lines. For a $8\frac{1}{2}'' \times 11''$ grid, approximately 7000 lines will be present.

To produce a colored image, for example a red image, the following procedure is performed. Red light is directed toward the colored grid and the grid functions to selectively absorb or transmit light incident upon it. For example, when red light contacts grid 304, the light is able to pass through the red portions of the grid to polymerize composition 308, as represented by 308B. The green and blue portions of the grid effectively absorb the red light to prevent composition 308 from polymerizing as represented by 308A. Pressure is then applied to system 300 to cause the black color-forming agent contained in composition 308A to migrate to receiver sheet 306 and form black image 312. To view the image, the viewer looks through the colored grid and will only be able to view images where composition 310 has not been developed on receiver sheet 306, as the black color developed will block the formation of a colored image. Accordingly, as the only areas as seen in FIG. 7 which are not developed on sheet 306 are the areas lying directly below the red portions of grid 304, a red image will be viewed. This assembly relies upon the color grid for production of color images, and not upon the use of different color image-forming agents.

To produce a transfer image, sheet 306 is removed and system 300 is pressure contacted with a receiver sheet (not pictured) to transfer composition 308A to the receiver sheet. A color grid (not pictured) identical in registration to grid 304 is the superimposed onto the receiver sheet. To view the image, the viewer looks through the color grid.

This system is advantageous in that highly contrasted color images would be produced as only the color from the grid, and not from the developed images would be viewed. In addition, the images which are developed on the receiver sheet can effectively function as a negative, particularly if the receiver sheet is colorless. The negative will be a black and white negative, however.

Figure 8A:
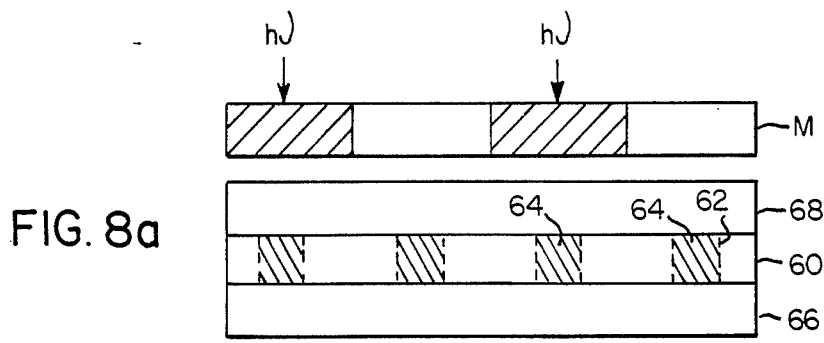
FIG. 8(a)–8(e) depicts a process for producing a planographic printing plate in accordance with the teachings of the present invention.
Figure 8B:
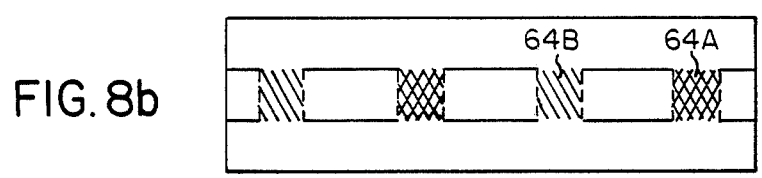
Figure 8C:
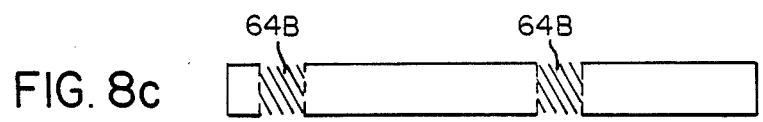
Figure 8D:
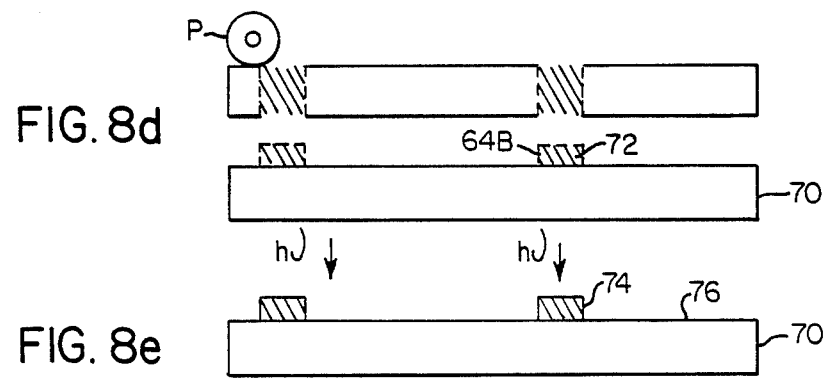
Figure 8E:
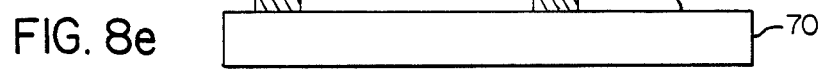

In yet another use, the present invention may be used to produce lithographic printing plates as is shown in FIGS. 8(a)–8(e). This use differs from the production of gravure type printing plates as described above. Referring to FIG. 8(a), substrate 60 has photosensitive composition 64 as defined above located in pores 62. Covering substrate 60 are cover sheets 66 and 68 to protect composition 64 against oxygen or water. Substrate 60 is then exposed to actinic radiation through Mask M to selectively harden composition 64 as is represented by 64A in FIG. 8(b). Composition 64 remains liquid in the non-exposed areas as represented by 64B. Cover sheets 66 and 68 are removed from substrate 60 (FIG. 8(c)) and substrate 60 is brought into contact with plate 70. As long as cover sheets 66 and 68 have good release properties, composition 64B will not inadvertently transfer to sheets 66 and 68 during their removal.

Plate 70 is made of a material commonly used for lithographic type printing plate.. Examples of such materials include anodized aluminum treated with an alkali metal silicate, oxidized aluminum, stainless steel, cobalt plated steel, copper-coated steel, chrome-plated steel, copper-coated epoxy and the like. Pressure is then applied to substrate 60 by roll P to cause composition 64B to transfer to plate 70 in area 72.

At this stage in the plate formation process, composition 64B is in liquid from on plate 70. Plate 70 is then given an overall exposure to actinic radiation to harden composition 64B on plate 70 as is represented by 74.

Areas 74 are hydrophobic or oleophilic and are receptive to printing ink. Areas 76 which do not contain any photohardened material are hydrophilic and not receptive to printing ink. In use, printing ink which is nonaqueous in nature is coated onto plate 70 whereupon the ink migrates to the surface of areas 74 and does not coat surface 76. Plate 70 is then used to produce images by the release of ink from area 74 to a receiver sheet as is know in the art.

Figure 9:
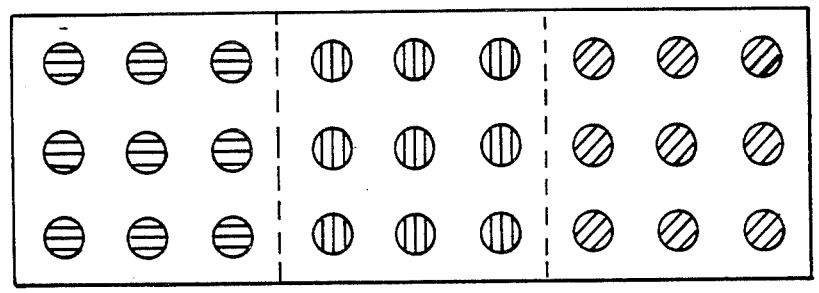
FIG. 9 depicts an alternative imaging sheet embodying the teachings of the instant invention which is capable of producing full-color images.

An additional way to form full-color images is by using the imaging sheet and process shown in FIGS. 9 and 10. Referring to FIG. 9, an imaging sheet 500 contains three regions 502, 504 and 506. The area of regions 502, 504 and 506 is identical and is approximately equal to the area of the final produced image. Each of areas 502, 504 and 506 contain a porous matrix represented by elements 508, 510 and 512. Matrices 508, 510 and 512 are typically identical to matrix 14 of FIG. 1. Alternatively, matrices 508, 510 and 512 may take the form of matrix 26 of FIG. 2 or matrix 36 of FIG. 3. Contained within porous matrices 508, 510 and 512 are photosensitive compositions 514, 516 and 518.

Compositions 514, 516 and 518 typically include a photohardenable monomer and a photoinitiator and are identical to those described for FIGS. 1 and 5. The photoinitiators for each of compositions 514, 516 and 518 are sensitive to different wavelengths of actinic radiation. Compositions 514, 516 and 518 may optionally include different image-forming agents. In the preferred embodiment, the image-forming agents comprise cyan, magenta and yellow colorless color-forming agents. For example, the cyan color-forming agent may be maintained in composition 514, the magenta color-forming agent may be maintained in composition 516 and the yellow color-forming agent may be maintained in composition 518.

In an alternative embodiment, not pictured, an imaging sheet useful for forming two color images may be provided. This embodiment is identical to imaging sheet 500 except that instead of the sheet having three equal area regions, the sheet has two equal regions. Each region has a porous matrix which houses a different photosensitive composition.

To produce a full-color color image using the imaging sheet of FIG. 9, the process according to FIGS. 10 (a)–(d) is utilized. Referring to FIG. 10(a), imaging sheet 500 is pictured, being identical to imaging sheet 500 of FIG. 9. Imaging sheet 500 is maintained between cover sheets 520 and 522, which typically comprise transparent polymeric films as described with respect to sheets 46 and 48 of FIG. 4. Alternatively, as described above, sheets 520 and 522 may take the form of heat meltable materials, peelable polymeric films, solvent cast films, or aerosol applied films. Cover sheets 520 and 522 function to protect sheet 500 against oxygen and moisture.

Figure 10A:
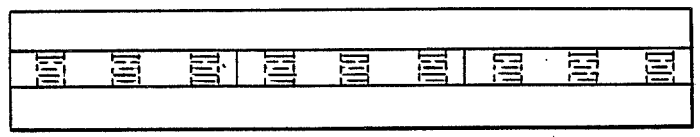
FIG. 10 (a)–(d) depicts a process for producing full-color images using the imaging sheet of FIG. 9.
Figure 10B:
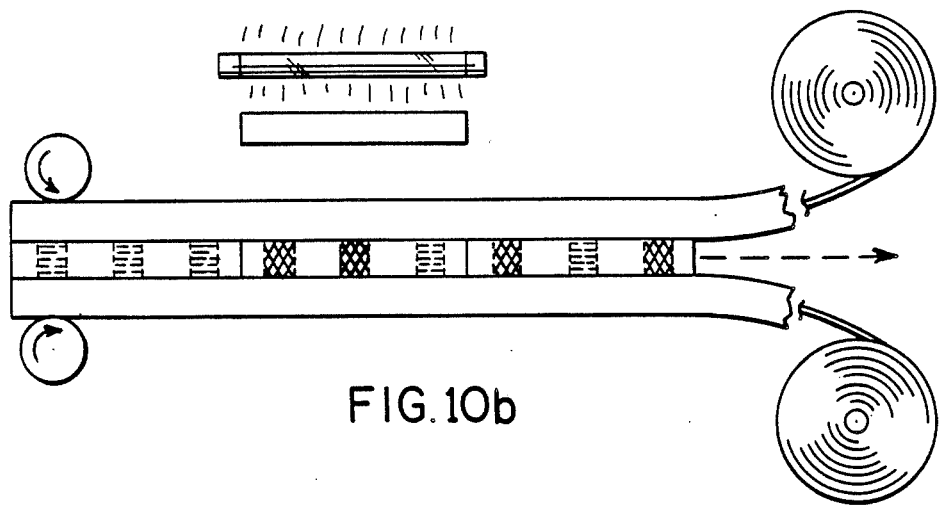

Referring now to FIG. 10(b), the exposure of imaging sheet 500 is shown in greater detail. To expose the three regions 502, 504, and 506 to actinic radiation from light source L, typically a visible or ultraviolet light source, the three regions are sequentially advanced, through the exposure source L by rollers R1 and are independently exposed. For each exposure, one region of imaging sheet 500 is image-wise exposed through full color mask M. Full color mask M functions to selectively filter color to enable latent images corresponding to one of three different colors used for forming a full-color image to be produced on regions 502, 504 and 506.

For example, referring to region 502, mask M functions to selectively absorb the wavelengths corresponding to the colors laying directly above composition 514B but does not absorb the wavelengths corresponding to the colors laying directly above composition 514A. The selective absorption of the mask M is akin to the full color grid described in FIG. 7. Accordingly, only composition 514A polymerizes. Similarly, referring to region 54, mask M selectively filters the wavelengths corresponding to the colors laying directly above composition 516B while not filtering the wavelengths corresponding to the colors laying directly above composition 516A so that composition 516A photohardens. Alternatively, mask M can optionally take the form of a computer control which causes light source L to selectively irradiate regions 502, 504 and 506 such that each region is subjected to an independent image-wise exposure. Each exposure corresponds to the appropriate exposure for one of the three colors ultimately used to form a full color image.

Once each of regions 502, 504 and 506 have been image-wise exposed, cover sheets 520 and 522 are removed from sheet 500 by winding around take-u rolls R2, or by other means as are known in the art.

Figure 10C:
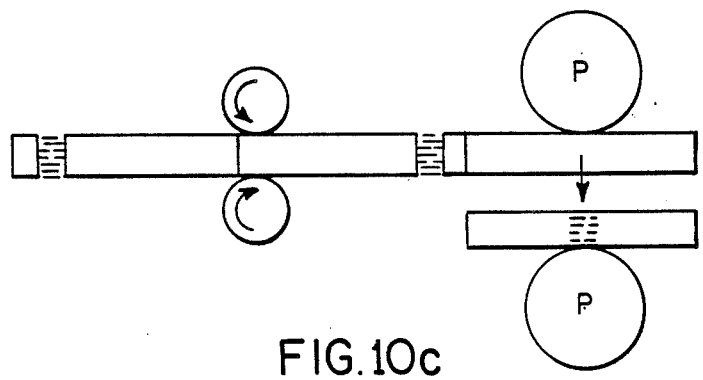
Figure 10D:
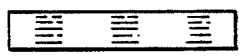

Referring now to FIG. 10(c), imaging sheet 500 is sequentially advanced by rolls 524 and 526 and subjected to pressure via rollers P in the presence of a receiver sheet 528 to cause the non-photohardened compositions 514B, 516B and 518B to transfer from regions 502, 504 and 506 to receiver sheet 528. In a preferred embodiment, receiver sheet 528 has a layer of developer material coated on its upper surface to enable the cyan, magenta and yellow color-forming agents to react with the developer material and form a visible full color image. The full-color image produced on sheet 528 is shown in FIG. 10(d). Color images 530, 532 and 534 respectively correspond to the colors formed by the image-forming agents exuded from compositions 514B, 516B and 518B.

If only a two-color image is desired, the identical process may be repeated with the exception that a two color imaging sheet is substituted for imaging sheet 500 of FIG. 10(a).

Other methods for forming full color images using a process akin to that shown in FIG. 10 may be practiced within the scope of the present invention. For example, instead of maintaining the image-forming agents in compositions 514, 516 and 518 prior to exposure, the three image-forming agents can be sequentially applied to regions 502, 504 an 506 after exposure to form full color images. As an example, a cyan dye or color-forming agent can be applied to region 502 prior to the application of pressure to cause the cyan color-former to migrate through the non-photohardened regions of matrix 508 and onto receiver sheet 528 upon the application of pressure. Because each of the respective color-forming agents are applied only in association with one region f sheet 500, there is no significant risk of image-forming agent intermixing. Similarly, magenta and yellow dyes or color-forming agents may be associated with regions 504 and 506 as described above with respect to the cyan color-forming agent. A full color image is formed on receiver sheet 528 after the three pressure application steps have been performed.

In still another embodiment, not pictured, the non-photohardened areas are evacuated after exposure but prior to development by using means known in the art, such as vacuum evacuation. In this embodiment, after exposure each of the regions are advanced through a vacuum evacuation station, and once the areas have been evacuated, the respective dyes or color-forming agents are applied to the regions prior to contact with the receiver sheet. When used in his manner, the regions of imaging sheet 500 effectively function akin to a silk screen whereupon three screens for the three color-formers are produced and are sequentially advanced to receiver sheet 528 to enable the formation of full-color images.

Figure 11:
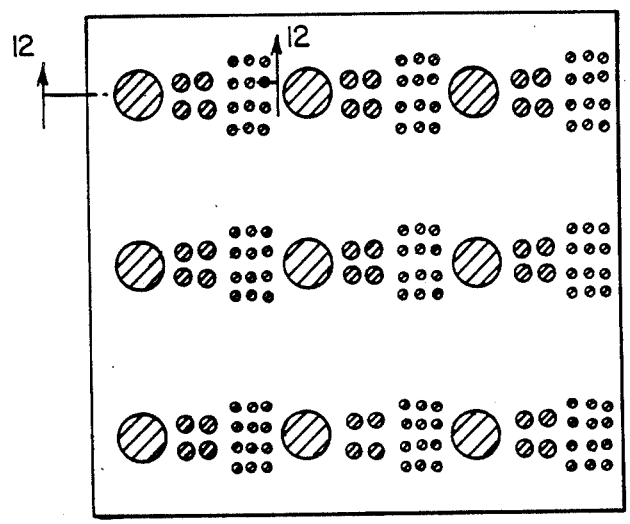
FIG. 11 depicts an alternative imaging sheet embodying the teachings of the instant invention which is capable of producing full-color images.

Another embodiment for forming full-color images is shown in FIG. 11. In this embodiment, imaging sheet 400 includes substrate 402 having an open porous matrix comprising three diameters of pores as represented by elements 404, 406 and 408. In practice, the number and size of pores 444, 406 and 408 are selected so that the amount of composition 410, 412 and 414 maintained in pores 404, 406 and 408 is approximately equal. Compositions 410, 412 and 414 are preferably photohardenable compositions containing a photopolymerizable or photo-crosslinkable material and a photoinitiator as described with respect to FIG. 1. Each of compositions 410, 412 and 414 preferably have different image-forming agents associated therewith as is described with respect to the embodiment shown in FIG. 5.

Compositions 410, 412 and 414 are particularly characterized by having different viscosities so that no undesired image-forming agent intermixing occurs prior to exposure. As is understood in the field of solid porous membrane theory, the interaction between contact angle, viscosity, pressure, surface properties of the membrane and pore size controls the interaction between the liquid maintained in the pores and the solid membrane. Accordingly, by optimizing these variables liquid compositions can be designed to specifically associate with a particular pore size of the membrane.

Figure 12:
FIG. 12 is a view taken along line 12—12 of FIG. 11.

According to the Hagen-Poiseuille relationship for the proportionality of pore diameter and liquid viscosity on fluid flow flux, assuming that the pressure differential across all areas of the membrane is maintained as a constant, the relationship between the viscosity of the liquid and the pore diameter is a square relationship, i.e., the factor (pore diameter)$^2$/liquid viscosity is a constant. Accordingly, to maintain the flux at a constant across the membrane, for every increase of pore diameter by a factor of two there must be an increase in viscosity of the liquid maintained in the pores by a factor of four. For example, referring to FIG. 12, the diameter of pore 404 is twice as large as the diameter of pore 406 and four times as large as the diameter of pore 408. Accordingly, the viscosity of composition 410 is four times greater than the viscosity of composition 412 and sixteen times greater than the viscosity of composition 414. The viscosity of the respective compositions must not be so high as to prevent the migration of the non-photohardened composition from tee porous matrix upon the application of pressure.

To alter the viscosity of compositions 410, 412 and 414, polymerizable or non-polymerizable viscosity additives may be added to the compositions. Examples of polymerizable additives include dipentaerythritol hydroxypentaacrylate (DPHPA), ethoxy ethoxylated bis-phenol-A diacrylate (sold under the trade name Viscoat 700), and other monofunctional and bifunctional acrylates. Non-polymerizable modifiers include natural and synthetic waxes which are miscible with the monomer present in the internal phase and preferably having a melting point between 30° and 85° C. Examples of such waxes include, but are not limited to, beeswax, hydrocarbons such as pentacosane, heptacosane, octacosane, nonacosane, hetriacosane and melene, free wax acids such as lignoceric acid, cerotic acid and melissic acid; esters of wax acids such as myricyl palmitate and ceryl 2-hydroxypalmitate; carnauba wax, Japan wax, Jojoba wax, mineral waxes, petroleum waxes such as paraffin waxes; and synthetic waxes such as polyethylene waxes and Fischer-Tropsch waxes.

To produce full-color images using imaging sheet 400 of FIG. 11, sheet 400 is image-wise exposed to three different bands of actinic radiation to selectively harden the different compositions and the substrate is pressure contacted with a receiver sheet to cause the non-photohardened compositions to image-wise exude from the porous matrix and form a full-color image on the receiver sheet.

Alternatively, if only a two color image is desired, an imaging sheet identical to sheet 400 of FIG. 11 may be produced with the difference being that only two pore sizes are provided throughout the substrate instead of three pore sizes.

By utilizing the inventive imaging sheets, other uses involving transfer of a material through the imaging sheets to a receiver material may be envisioned as will be appreciated in the art. For example, it is possible to produce a printed circuit board by transferring the electrically conductive materials through the inventive imaging sheet and onto an electrically conductive plate and subsequently curing the conductive materials onto the plate by post transfer procedures.

The present invention is illustrated in more detail by the following non-limiting examples:

EXAMPLE 1

The following photosensitive composition was formed by mixing together at ambient condition the following materials:

Trimethylolpropane triacrylate (TMPTA): 40.00 g

Dipentaerythritol hydroxypentaacrylate: (DPHPA): 14.64 g

Isopropylthioxanthone: 1.60 g

Crystal violet lactone: 4.00 g

Ethyl-4-(dimethylamino)benzoate: 3.20 g

A Nuclepore polycarbonate membrane having pores with an average pore size of 1 micron is placed onto a transparent polyester film having a thickness of 23 microns. The photosensitive composition is delivered to the open surface of the membrane and distributed through its pores by use of a spatula. A second polyester sheet, identical in structure to the first sheet, is applied onto the open surface of the membrane and pressure was applied to the upper surface by means of a ruler to drive off all air bubbles contained within the membrane. The assembly was then run through pressure rollers at about 400 p.l.i. to ensure an even distribution of composition throughout the membrane's porous structure and to create an effective seal. The membrane was exposed to ultraviolet and fluorescent light at a distance of 4 inches using a standard step wedge as a photographic mask for exposure time periods ranging from 16 to 8192 seconds. For each exposure time period, one of the polyester cover sheets was removed and replaced with a receiver sheet having a phenolic developer resin located on one of its surfaces and an additional paper cover was placed onto the remaining cover sheet. This assembly was run through pressure rollers at about 400 p.l.i. and the receiver sheet was removed from the assembly. High contrast, highly resolved images were formed on the receiver sheet. Images were formed for each of the exposure times selected, demonstrating that the system obeyed reciprocity in a time domain ranging from 4 to 8192 seconds.

EXAMPLE 2

To determine if the method of Example 1 could produce images having midtone contrasts, the technique of Example 1 was repeated with the exceptions that a Nuclepore polycarbonate membrane having pores with an average pore size of 3 microns was used, an exposure time of 4 seconds to three bulbs of white, fluorescent, and ultraviolet light at a distance of about 8 inches was selected, and the composition was exposed through a photograph mask having an image of a human face. A highly resolved image was produced having excellent midtone contrast.

EXAMPLE 3

The experiment of Example 1 was repeated using the following photosensitive composition:
TMPTA: 150 g
Cyanine salt of: 0.6 g Triphenyl-n-butylborate:
Diisopropyldimethylaniline (DIDMA): 1.5 g
Hilton Davis HD-5100: 36 g (cyan color former):
A highly resolved, high contrast image was produced.

EXAMPLE 4

The experiment of Example 2 was repeated using the composition of Example 3. An acceptable image was produced.

EXAMPLE 5

The photosensitive composition of Example 1 was applied to a highly porous sheet of thin packing paper. Upon application, the capillary action of the paper caused the composition to be rapidly absorbed into the paper's porous matrix. The composition absorbed paper was placed between two polyethylene terephthalate sheets and pressure was applied to the assembly obtain a tight seal. The paper was exposed to both fluorescent and ultraviolet light at a distance of 4 inches through a step wedge for an exposure time of 256 seconds. One of the polyethylene terephthalate cover sheets was removed and replaced with a receiver paper and the composition containing paper and receiver paper were passed through pressure rollers to transfer the nonexposed composition to the receiver sheet. An image was produced having good color density and acceptable high and midtone contrast. This application is particularly suited for copying operations wherein high volume, low cost copies are desired.

EXAMPLE 6

The experiment of Example 5 was repeated with the exception that the exposure time was increased to 512 seconds. An acceptable image was produced on the receiver sheet.

EXAMPLE 7

Photosensitive microcapsules containing a photohardenable monomer (TMPTA) and an ultraviolet photoinitiator were coated onto a polyester film. The film was exposed to ultraviolet light at a distance of 4 inches for 60 seconds to completely polymerize the monomer and harden the microcapsules on the polyester substrate. The following photosensitive composition was formed by mixing the following constituents together at ambient conditions:
TMPTA: 40 g
DPHPA: 14.64 g
Isopropylthioxanthone: 1.6 g
Crystal violet lactone: 4.0 g
and the composition was applied onto the hardened capsule coated surface such that the composition filled the interstitial spaces between the hardened microcapsules. A transparent plastic sheet was applied onto the capsule coated surface and pressure was applied to remove excess photosensitive composition and air bubbles and to seal the coated composition from air and water degradation. A step wedge was positioned on top of the transparent plastic sheet and the composition was exposed for 64 seconds through the cover sheet and step wedge with ultraviolet and visible light. The cover sheet was removed and replaced with a receiver sheet having a phenolic developer layer and the assembly was passed through pressure rollers to cause the nonexposed composition to migrate from the capsule coated surface and to the receiver sheet. A high quality, highly resolved image was produced.

COMPARATIVE EXAMPLE 7

The experiment of Example 7 was repeated with the exception that the photosensitive composition was directly deposited onto a polyester substrate instead of being deposited onto a capsule coated substrate. Although an image was produced, its density was not uniform and a portion of the photosensitive composition was inadvertently removed during the removal of the cover sheet.

By utilizing the present invention, the following advantages are achieved:
(1) Ability to produce images from "microcapsule-type" technology without having to form microcapsules;
(2) Elimination of all complications associated with photosensitive microcapsules including a reduction in the amount of pressure required for processing as no rupturing step is required;
(3) Improved uniformity of coating of photosensitive material;
(4) Control of photographic properties such as dynamic range, density, gamma, etc. by controlling crosslinking profile across porous imaging sheet;
(5) Ability to form more than one image depending on amount of image-forming agent which may be retained in porous matrix;
(6) Improved handleability of the photosensitive material;
(7) Simplicity of processing conditions; and
(8) The ability to simultaneously produce mirror images from a single imaging sheet.

Having described the invention in detail and by reference to preferred embodiments thereof, it will be apparent that modifications and variations are possible without departing from the scope of the invention defined n the appended claims.

What is claimed is:

1. A transfer sheet comprising:
   a first region having an open porous matrix and a first photohardenable composition contained within said porous matrix, said composition being sensitive to a first wavelength of actinic radiation and undergoes a change in viscosity upon exposure to said first wavelength of actinic radiation;
   a second region having an open porous matrix and a second photohardenable composition contained within said porous matrix, said composition being sensitive to a second wavelength of actinic radiation different from said first wavelength of actinic radiation and undergoes a change in viscosity upon exposure to said second wavelength of actinic radiation; and
   a third region having an open porous matrix and a third photohardenable undergoes composition contained within said porous matrix, said composition being sensitive to a third wavelength of actinic radiation different from said first and second wavelengths of actinic radiation and undergoes a change in viscosity upon exposure to said third wavelength of actinic radiation;
   said first, second and third regions having approximately the same area and being located separately on said sheet;
   said transfer sheet being used in a process wherein said first, second and third regions are sequentially image-wise exposed to actinic radiation and are sequentially brought into pressure contact with a receiver sheet such that the nonhardened composition from each of said first, second and third regions image-wise transfers from said imaging sheet to said receiver sheet.

2. The sheet according to claim 1 further comprising a first image-forming agent associated with said first photohardenable, a second image-forming agent associated with said second photohardenable composition, and a third image-forming agent associated with said third photohardenable composition.

3. The sheet according to claim 2 wherein said first image-forming agent is located in the open porous matrix of said first region, said second image-forming agent is located in the open porous matrix of said second region and said third image-forming agent is located in the open porous matrix of said third region.

4. The sheet according to claim 2 wherein said first, second and third image-forming agents respectively comprise cyan, magenta and yellow image-forming agents.

5. The sheet according to claim 4 wherein each of said first, second and third image-forming agents comprise colorless color-forming agents.

6. The sheet according to claim 2 wherein said first photohardenable comprises a photopolymerizable or photocrosslinkable monomer and a photoinitiator, said second photohardenable comprises a photopolymerizable or photocrosslinkable monomer and a photoinitiator, and said third photohardenable comprises a photopolymerizable or photocrosslinkable monomer and a photoinitiator.

7. The sheet according to claim 6 wherein said sheet further comprises cover sheets which surround said imaging, sheet to protect said photohardenable composition from oxygen.

8. The sheet according to claim 6 wherein said sheet further comprises a material coated onto the upper and lower surfaces of said imaging sheet wherein said material protects said photohardenable material from oxygen and wherein said material is selected from the group consisting of heat meltable materials, peelable polymeric films, solvent cast films and aerosol applied film materials.

9. A system for forming full color images comprising:
   the imaging sheet according to claim 2; and
   a receiver sheet for receiving said image-forming agents when said imaging sheet is sequentially subjected to pressure to cause said image-forming agents to image-wise exude from said porous matrices of said first, second and third regions and contact said receiver sheet.

10. The system according to claim 9 wherein said image-forming agents comprise colorless color-forming agents which form an image upon reaction with a developer material and wherein said receiver sheet has coated on one of its surfaces a layer of the developer material capable of reacting with aid colorless color-forming agents.

11. A transfer sheet comprising:
    a first region having an open porous matrix and a first photohardenable composition contained within said porous matrix, said composition being sensitive to a first wavelength of actinic radiation and undergoes a change in viscosity upon exposure to said first wavelength of actinic radiation; and
    a second region having an open porous matrix and a second photohardenable composition contained within said porous matrix, said composition being sensitive to a second wavelength of actinic radiation different from said first wavelength of actinic radiation and undergoes a change in viscosity upon exposure to said second wavelength of actinic radiation;
    said first and second regions having approximately the same area and being located separately on said sheet;
    said transfer sheet being used in a process wherein said first and second regions are sequentially image-wise exposed to actinic radiation and are sequentially brought into pressure contact with a receiver sheet such that the nonhardened composition from each of said first and second regions image-wise transfers from said imaging sheet to said receiver sheet.

12. The sheet according to claim 11 further comprising a first image-forming agent associated with said first photohardenable composition and a second image-forming agent associated with said second photohardenable composition.

13. The sheet according to claim 12 wherein said first image-forming agent is located in the open porous matrix of said first region and wherein said second image-forming agent is located in the open porous matrix of said second region.

14. The sheet according to claim 12 wherein said first and second image-forming agents are colorless color-forming agents.

15. The sheet according to claim 12 wherein said first photohardenable a photopolymerizable or photocrosslinkable monomer and a photoinitiator; and wherein said second photohardenable or photosoftenable composition comprises a photohardenable composition including a photopolymerizable or photocrosslinkable monomer and a photoinitiator.

16. The sheet according to claim 15 wherein said sheet further comprises cover sheets which surround said imaging sheet to protect said photohardenable composition from oxygen.

17. The sheet according to claim 15 wherein said sheet further comprises a material coated onto the upper and lower surfaces of said imaging sheet wherein said material protects said photohardenable material from oxygen and wherein said material is selected from the group consisting of heat meltable materials, peelable polymeric films, solvent cast films and aerosol applied film materials.

18. A process for forming full-color images comprising the steps of:
providing a transfer sheet comprising a first region having an open porous matrix and a first photohardenable composition contained within said porous matrix, said composition being sensitive to a first wavelength of actinic radiation and undergoes a change in viscosity upon exposure to said first wavelength of actinic radiation; a second region having an open porous matrix and a second photohardenable or composition contained with said porous matrix, said composition being sensitive to a second wavelength different from said first wavelength and undergoes change in viscosity upon exposure to said second wavelength of actinic radiation; and a third region having an open porous matrix and a third photohardenable composition contained within said porous matrix, said composition being sensitive to a third wavelength of actinic radiation different from said first and second wavelengths and undergoes a change in viscosity upon exposure to actinic radiation;
sequentially image-wise exposing said first, second and third regions to said first, second and third wavelengths of actinic radiation;
associating a first image-forming agent with said first region and applying pressure to said first region in the presence of a receiver sheet to cause said first image-forming agent to image-wise exude from said porous matrix and transfer to said receiver sheet;
associating a second image-forming agent with said second region and applying pressure to said second region in the presence of said receiver sheet to cause said second image-forming agent to image-wise exude from said porous matrix and transfer to said receiver sheet; and
associating a third image-forming agent with said third region and applying pressure to said third region in the presence of said receiver sheet to cause said third image-forming agent to image-wise exude from said porous matrix and transfer to said receiver sheet.

19. The process according to claim 18 wherein each of said first, second and third photohardenable compositions comprise a photohardenable composition including a photopolymerizable or photocrosslinkable monomer and a photoinitiator.

20. The process according to claim 19 comprising the additional step of maintaining said substrate in an oxygen-free and water-free environment during said image-wise exposure steps.

21. The process according to claim 20 wherein said maintaining said substrate step comprises attaching transparent cover sheets to the upper and lower surfaces of said substrate.

22. The process according to claim 19 wherein said first image-forming agent comprises a cyan color-forming agent, said second image-forming agent comprises a magenta color-forming agent and said third image-forming agent comprises a yellow color-forming agent.

23. The process according to claim 22 wherein said associating said first, second and third image-forming agent steps comprise the steps of distributing said first image-forming agent throughout said open porous matrix of said first region prior to said associated image-wise exposing step;
distributing said second image-forming agent throughout said open porous matrix of aid second region prior to said associated image-wise exposing step; and
distributing said third image-forming agent throughout said open porous matrix of said third region prior to said associated image-wise exposing step.

24. The process according to claim 22 wherein said associating said first, second and third image-forming agent steps comprise the steps of:
distributing said first image-forming agent throughout said open porous matrix of said first region after said associated image-wise exposing step;
distributing said second image-forming agent throughout said open porous matrix of said second region after said associated image-wise exposing step; and
distributing said third image-forming agent throughout said open porous matrix of said third region after said associated image-wise exposing step.

25. The process according to claim 24 wherein said associating said first image-forming agent comprises evacuating the non-photohardened composition from said open porous matrix of said first region and replacing said composition with said first image-forming agent;
said associating said second image-forming agent comprises evacuating the non-photohardened composition from said open porous matrix of said second region and replacing said composition with said second image-forming agent; and
said associating said third image-forming agent comprises evacuating the non-photohardened composition from said open porous matrix of said third region and replacing said composition with said third image-forming agent.

26. The process according to claim 25 wherein said evacuating steps comprises the steps of sequentially advancing said first, second, and third regions through a vacuum.

27. The process according to claim 22 wherein said cyan, magenta and yellow color-forming agents comprise colorless color-forming agents capable of reacting with a developer material to form a visible image and wherein said receiver sheet comprises a substrate having coated on one of its surfaces a layer of said developer material.

28. The process according to claim 22 wherein said first, second and third wavelengths are wavelengths occurring in the visible spectrum.

29. The process according to claim 28 wherein said first wavelength corresponds to red light, said second wavelength corresponds to green light and said third wavelength corresponds to blue light.

* * * * *

UNITED STATES PATENT AND TRADEMARK OFFICE
CERTIFICATE OF CORRECTION

PATENT NO. : 4,912,014
DATED : March 27, 1990
INVENTOR(S) : Feldman

It is certified that error appears in the above-identified patent and that said Letters Patent is hereby corrected as shown below:

In column 21, line 20, please delete "undergoes";

In column 21, line 40, please insert --composition-- after "photohardenable";

In column 21, lines 58, 60 and 62, insert --composition-- before "comprises";

In column 22, line 65, insert --composition comprises-- after "photohardenable" and at lines 67, 68 to column 23, line 1, delete "or photosoftenable composition comprises a photohardenable composition including" and insert --composition comprises--;

In column 23, line 25, delete "or".

Signed and Sealed this

Seventeenth Day of March, 1992

Attest:

HARRY F. MANBECK, JR.

*Attesting Officer*  *Commissioner of Patents and Trademarks*